United States Patent [19]

Hsu

[11] 4,312,680
[45] Jan. 26, 1982

[54] METHOD OF MANUFACTURING SUBMICRON CHANNEL TRANSISTORS

[75] Inventor: Sheng T. Hsu, Lawrenceville, N.J.
[73] Assignee: RCA Corporation, New York, N.Y.
[21] Appl. No.: 136,157
[22] Filed: Mar. 31, 1980
[51] Int. Cl.³ .................. H01L 21/225; H01L 21/308; H01L 29/78
[52] U.S. Cl. ........................ 148/1.5; 29/571; 148/187; 357/23; 357/59; 357/91
[58] Field of Search .................. 148/1.5, 187; 357/59, 357/23, 91; 29/571

[56] References Cited

U.S. PATENT DOCUMENTS

| | | | |
|---|---|---|---|
| 3,623,923 | 11/1971 | Kennedy et al. | 148/175 |
| 3,738,880 | 6/1973 | Laker | 156/17 |
| 4,026,740 | 5/1977 | Owen | 148/187 |
| 4,124,933 | 11/1978 | Nicholas | 29/578 |
| 4,162,504 | 7/1979 | Hsu | 357/23 |
| 4,201,603 | 5/1980 | Scott, Jr. et al. | 148/174 |
| 4,232,327 | 11/1980 | Hsu | 357/23 |

FOREIGN PATENT DOCUMENTS 2807138  8/1978  Fed. Rep. of Germany ........ 357/42

*Primary Examiner*—Upendra Roy
*Attorney, Agent, or Firm*—Birgit E. Morris; Donald S. Cohen; Lawrence P. Benjamin

[57] ABSTRACT

A short channel insulated gate field effect transistor, suitable for use in high speed integrated circuits is described as being manufactured by a self-aligned process in which the gate electrode is formed by a selective etching technique. In practicing the process, an etch limiting element is laterally diffused from an adjacent solid source into a polycrystalline silicon layer. In one embodiment, a portion of the solid source serves as a mask in another step of the process to define the length of a drain extension region.

11 Claims, 11 Drawing Figures

METHOD OF MANUFACTURING SUBMICRON CHANNEL TRANSISTORS

This invention relates to the processing of semiconductor devices and, more particularly, to an improved method of manufacturing a submicron channel transistor having a polycrystalline silicon gate.

The use of polycrystalline silicon material (polysilicon) as the gate member for an MOS transistor or as an interconnecting lead between MOS transistors and other electrical components of an integrated circuit is both well known and highly desirable in the semiconductor art. In the past, the dimensions of either polysilicon gates or inteconnects were defined by using standard photolithographic techniques which, by the very nature of the process, limits the narrowness that could be achieved.

One early prior art technique that was developed in order to produce a relatively narrow dimensioned polysilicon line is described in U.S. Pat. No. 3,738,880 to A. Laker which issued on June 13, 1973 entitled "Method of Making Semiconductor Device." In this reference, a p-type dopant is diffused into a polysilicon layer through a slit in a masking layer in order to form a doped strip or line in the polysilicon layer. After removing the masking layer, only the undoped portion of the polysilicon layer is selectively removed by an etchant which, by its nature, will not attack the doped strip or line. This may be utilized to either form a gate member or to form an interconnect. However, the narrowness of the strip or line formed by this technique is limited by the photolithographic techniques used to form the initial opening in the masking layer. Further, it has been found that when the dopant is diffused through the slit in the masking layer and into the polysilicon layer, the dopant spreads laterally in the polysilicon layer. Thus, the doped strip or line is wider than the opening in the masking layer which defines the doped line.

Another method of manufacturing a narrow gate line or interconnect is described in U.S. Pat. No. 4,124,933 to K. Nicholas, which issued on Nov. 4, 1978, entitled "Method of Manufacturing Semiconductor Devices." In this latter reference a gate member is formed by laterally diffusing a gas-borne boron dopant into a polysilicon layer at the edges thereof. One difficulty that arises in the Nicholas process resides in the fact that this technique requires a relatively thick layer of gate oxide of the order of about $0.1\mu$ meter or 1,000 angstroms. The need for the thick oxide arises from the fact that a boron nitride source is used for the diffusion of boron into the edges of the polysilicon layer. It has been found that in addition to doping the edges of the polysilicon layer, a boron doped oxide is also formed on the exposed portions of gate oxide. Thereafter, when removing the boron doped oxide from the surfaces, in preparation for the subsequent processing, portions of the gate oxide layer under the boron doped polysilicon will also be removed, exposing the semiconductor body. Thus, to prevent this from happening and also to prevent boron from doping the body of semiconductor material through any such openings in the gate oxide layer, a thick oxide, of the order of about 1,000 angstroms is necessary. In instances where it is necessary to form a gate oxide to a thickness of about 100-200 angstroms, or about two orders of magnitude thinner than that shown in the Nicholas reference, the Nicholas reference is thus unsuitable. Accordingly, in instances where higher speed and lower gate capacitance is required, one must devise another scheme. Typically, gate oxides of the thickness of 100-200 angstroms is more desirable and hence, for these devices, the Nicholas technique cannot be utilized.

Devices which require gate insulators having a thickness of the order of about 100-200 angstroms is described, for example, in U.S. Pat. No. 4,162,504 to S. T. Hsu, which issued July 24, 1979 and entitled "Floating Gate Solid-State Storage Device" and in Ser. No. 946,772, filed Sept. 28, 1978 and entitled "Electrically Programmable Floating Gate Read Only Memory Device and Method for Making Same."

SUMMARY OF THE INVENTION

In accordance with the principles of my invention, there is described a method of producing a submicron, narrow gate transistor wherein an initial thick layer of masking oxide is deposited on a semiconductor body followed by a relatively thick layer of a heavily doped layer of glass followed by a cover layer of masking oxide. This multilayer structure is etched to expose an edge thereof and a layer of polysilicon is then deposited over the structure and the adjacent exposed edge. To define the gate, the device is heated to diffuse out of the heavily doped layer a controlled amount of dopant which extends into the polysilicon layer both horizontally and vertically. After a sufficient period of time, the undoped polysilicon is removed and the multilayer structure is removed. Thereafter, normal processing continues to form an MOS device. In the alternative, a portion of the multilayer structure is allowed to remain in order to form a drain extension region.

DETAILED DESCRIPTION OF THE INVENTION

It should be noted that while the foregoing exegesis, with regard to FIGS. 1–8, will be discussed in terms of a process for manufacturing a silicon-on-sapphire (SOS) device, it will be obvious to those skilled in the art that while sapphire is preferred, other similar insulators such as spinel and monocrystalline beryllium oxide may be used as the substrate.

Figure 1:
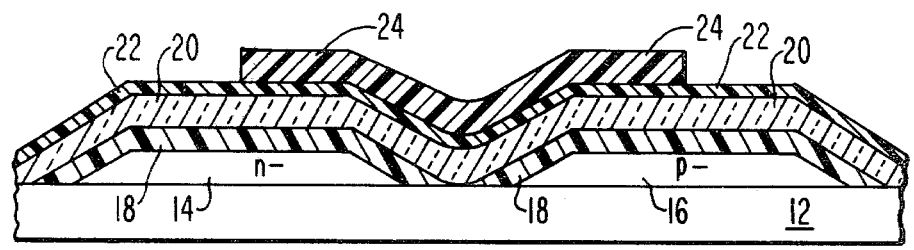
FIGS. 1–5 are sectional views illustrating the steps of carrying out the method of one embodiment of my invention.

Referring now to FIG. 1, there is shown the first steps in the formation of my device wherein a layer of monocrystalline silicon (not shown) is epitaxially grown over the entire surface of sapphire substrate 12 to a thickness of about 6000 angstroms ±500 angstroms in a well known manner. The layer of silicon may initially be grown having the n-type and p-type conductivities shown or, in the alternative, the islands may be appropriately doped after they have been formed. Islands 14 and 16 are formed by first growing a layer of masking oxide ($SiO_2$) over the entire epitaxially grown layer of silicon and then providing the layer of masking oxide with a patterned layer of photoresist to define the boundaries of the individual islands. The masking oxide is then etched using a buffered hydrofluoric (HF) acid solution and those portions of the SiO$_2$ layer are not covered by the pattern of the photoresist are removed down to the surface of the epitaxially grown silicon. The layer of photoresist is then removed and the now etched layer of SiO$_2$ is used as a mask in order to etch the epitaxially grown silicon. This is done using a buffered potassium hydroxide (KOH) solution.

Having defined islands 14 and 16, all SiO$_2$ masking material is removed using an HF solution and islands 14 and 16 are appropriately doped with n-type conductivity modifiers (phosphorous) to produce n-doped island 14 and p-type conductivity modifiers (boron) to produce p-doped island 16. The now doped islands 14 and 16 are then provided with a first layer 18 of thermally grown or, in the alternative, a densified chemically vapor deposited (CVD) SiO$_2$ layer to a thickness of about 2000–3000 angstroms followed by layer 20 which is a doped CVD oxide having a thickness of about 3000–4000 angstroms and which represents a solid source of dopant material. Layer 20 may be doped with boron atoms to a concentration of about $10^{20}$ atoms per cubic centimeter but may range from about $5\times10^{19}$ to about $5\times10^{20}$ boron atoms per cubic centimeter. The structure is then provided with layer 22, which is 1000 angstroms thick cap of CVD oxide. Thereafter, as shown in FIG. 1, the structure is provided with a layer of patterned photoresistive material 24 which acts as a mask for the following etching steps.

Figure 2:
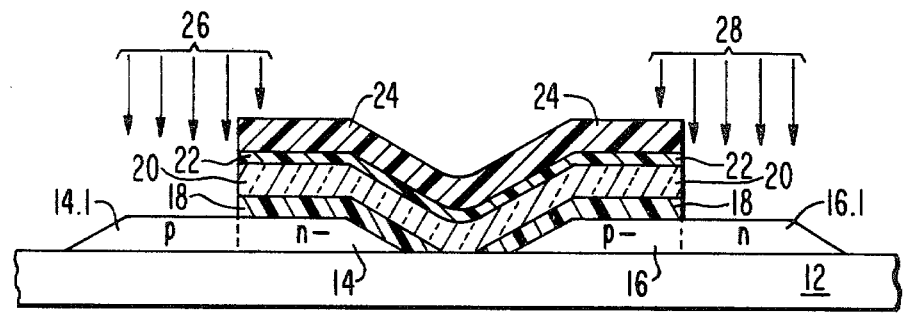

As shown in FIG. 2, the portions of the structure that remain unmasked are now etched away using an HF solution to remove all unmasked portions of oxide layers 18, 20 and 22, to expose portions of islands 14 and 16. After the etching step is completed, the right hand portion is masked (not shown) and the exposed portion of island 14 is then implanted with boron to a concentration of about $8-10\times10^{16}$ atoms of conductivity modifiers per cubic centimeter to form region 14.1. This is the portion of island 14 that eventually will represent the p-type channel region for an n-channel device. This implant step is shown symbolically by arrows 26. The material masking island 16 is then removed and a similar type of masking material is placed over island 14 (not shown) and the now exposed portions of island 16 are then subjected to an arsenic implantation, as shown symbolically by arrows 28, to form the n-type channel region 16.1 in island 16. To complete this step, all masking material 24, as well as any masking material to protect against implantation in islands 14 and 16 is removed.

Figure 3:
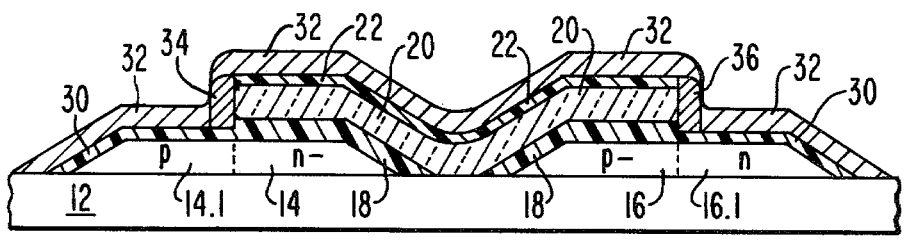

As shown in FIG. 3, the structure is now provided with a 300–500 angstrom thick, thermally grown layer of gate oxide 30 over the exposed portions of 14.1 in island 14 and exposed portion 16.1 in island 16. Thereafter, a layer of polycrystalline silicon 32 (polysilicon), about 4000–5000 angstroms thick is provided over the entire structure in intimate lateral contact with both the CVD oxide cap layer 22, the exposed edges of the heavily doped CVD oxide layer 20, the exposed edge of the densified CVD oxide layer 18, as well as gate oxide layer 30. At this point in the processing, the structure is subjected to a high temperature diffusion of the order of about 900° C. for a period of about 10 to 30 minutes in order that the dopant atoms previously introduced into doped oxide layer 20 diffuse out of the edges thereof into the adjacent undoped polysilicon layer in order to form the now doped polysilicon gate line 34 over the n-channel device in island 14 and the doped gate line 36 over the p-channel device in island 16.

Figure 4:
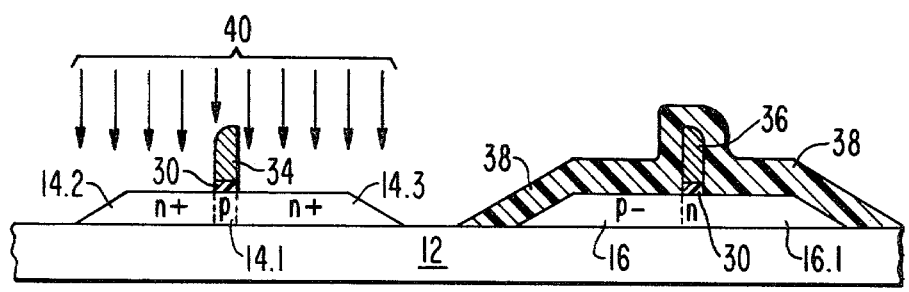
Figure 5:
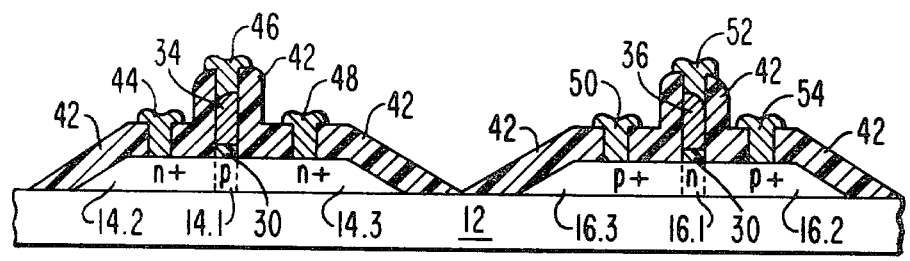

Thus, as shown in FIG. 3, doped submicron gate lines 34 and 36 are formed in the undoped polysilicon layer 32. As is described in U.S. Pat. No. 3,738,880 issued on June 13, 1973 to A. Laker and entitled "Method of Making A Semiconductor Device," there is available a selective etching or etch limiting process for the removal of the undoped polysilicon from the structure without affecting the doped polysilicon line. As described in U.S. Pat. No. 3,738,880 there are solvents in which polysilicon is relatively soluble, but in which p-doped polysilicon is substantially insoluble. Such solvents include aqueous hydrazine solutions, potassium hydroxidepropanol solutions and the like. By subjecting polysilicon layer 32 to such a solvent, the undoped portions of layer 32 will be removed to the exclusion of p-doped portions 34 and 36 resulting in the structure shown in FIG. 4. After removal of the undoped polysilicon layer 32, the now exposed oxide layers 22, 20, 18 and 30 are then removed by subjecting the structure to an HF solution which will remove all oxides from the structure and leaving only doped silicon gate lines 34 and 36 and islands 14 and 16. As shown in FIG. 4, island 16 is provided with an implant resistant material 38 in order that island 14 be appropriately doped (shown symbolically by arrows 40) with arsenic, for example, to form an n-channel device having source and drain regions 14.2 and 14.3. Having formed the n-channel device in island 14, implant resist material 38 is removed and a similar type material (not shown) is provided for island 14 after which island 16 is implanted with, for example, boron (not shown) in order to form the source and drain regions 16.2 and 16.3 shown in FIG. 5. Thereafter, to complete the processing and form adjacent p-channel and n-channel devices which may be interconnected to form a complementary symmetry device, both islands are provided with a layer of field oxide 42 and, then provided with a mask (not shown) and appropriately etched to provide the layer of field oxide 42 with appropriate contact openings as is well known in the art. Thereafter, the device is metallized to form metal contacts 44–54 in each of the openings.

Figure 6:
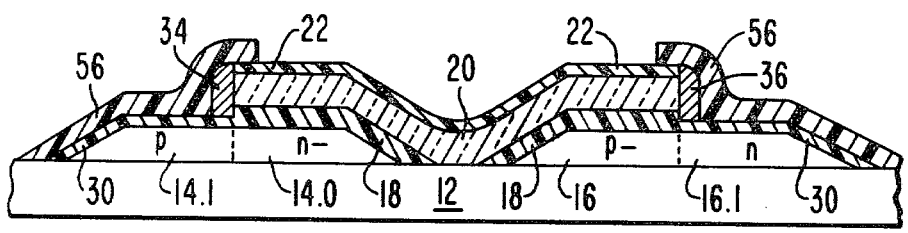
FIGS. 6–8 are sectional views illustrating the steps of carrying out the method of another embodiment of my invention wherein similar elements are similarly numbered to those appearing in FIGS. 1–5.
Figure 7:
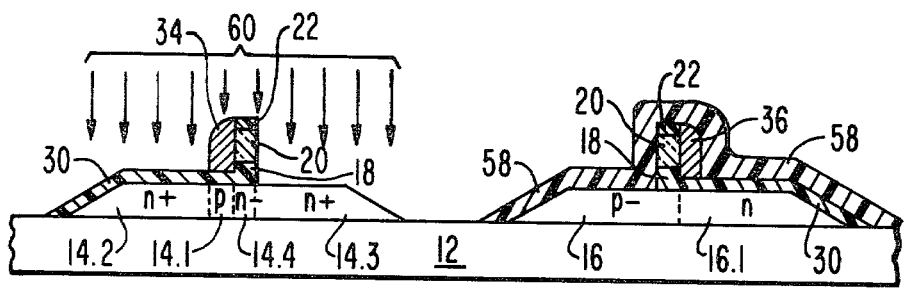
Figure 8:
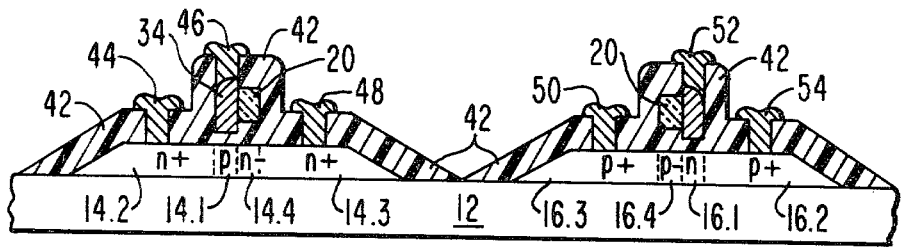

Referring now to FIGS. 6–8 which FIGURES, when taken in conjunction with FIGS. 1–3, illustrate the steps of carrying out the method of my invention in order to produce an extended drain device. It should be noted that similar elements in all FIGURES will be similarly numbered.

In this embodiment, one presumes the steps originally described with regard to FIGS. 1–3 have been accomplished and include the steps of depositing polysilicon layer 32 and diffusing the dopant in layer 22 into the contiguous portion of polysilicon layer 32 in order to form gates 34 and 36. Thereafter, the structure is subjected to a selective etchant as described in the above-mentioned Laker patent to remove only the undoped portions of polysilicon layer 32. Next, a patterned layer of etch resistant material 56 is deposited on the structure in order to cover the exposed portion of gate oxide 30, doped polysilicon gates 34 and 36 and a portion of the multilayer structure consisting of layers 18, 20 and 22. The portion of the overlap onto layer 22 will determine the width of the drain extension. Thereafter, the now exposed oxide layers 22, 20, 18 and 30 are removed by subjecting the structure to an HF etchant which will remove all of the oxides (except that portion of the oxide extending under layer 56). This will produce the structure shown in FIG. 7, which is then provided with an implant resistive material 58 in order that island 14 be appropriately doped with arsenic to form an n-channel device as shown symbolically by arrows 60. Implanting arsenic in this manner forms source region 14.2 and drain region 14.3 as well as channel region 14.1 and drain extension 14.4.

Having formed the n-channel device in island 14, implant resist material 58 is removed and a similar type of material (not shown) is provided over island 14 after which island 16 is implanted with, for example, boron (not shown) in order to form source and drain regions 16.2 and 16.3 therein as well as channel region 16.1 and drain extension 16.4 (FIG. 8). Thereafter, to complete the processing, and form, for example, a complementary symmetry device, both islands are provided with a layer of field oxide 42 and, thereafter provided with a mask (not shown) and appropriately etched to provide oxide layer 42 with contact openings as is well known in the art. Thereafter, the device is metallized, as shown in FIG. 8 to form metal contacts 44–54 in each of the openings.

Figure 9:
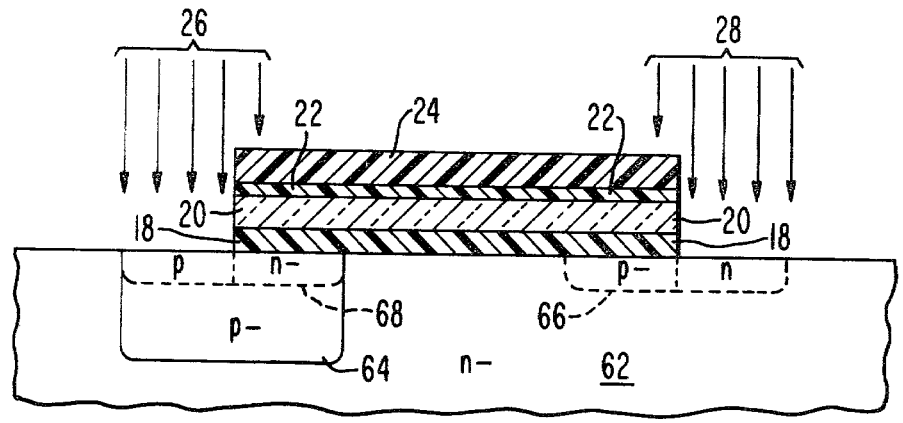
FIGS. 9–11 are sectional views illustrating the steps of carrying out the method of my invention utilizing bulk silicon wherein similar elements are similarly numbered to those appearing in FIGS. 1–8.
Figure 10:
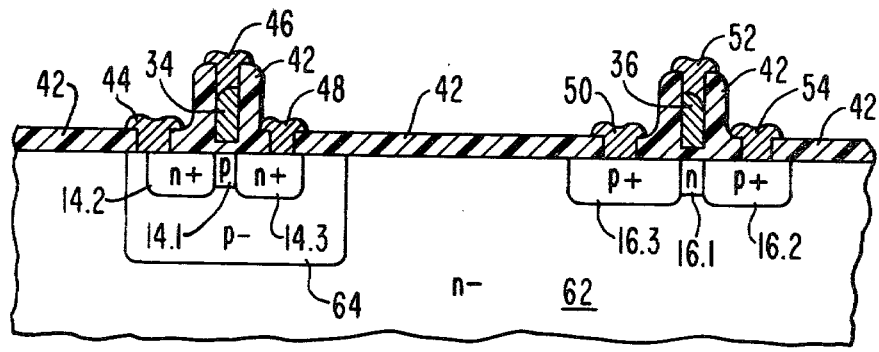
Figure 11:
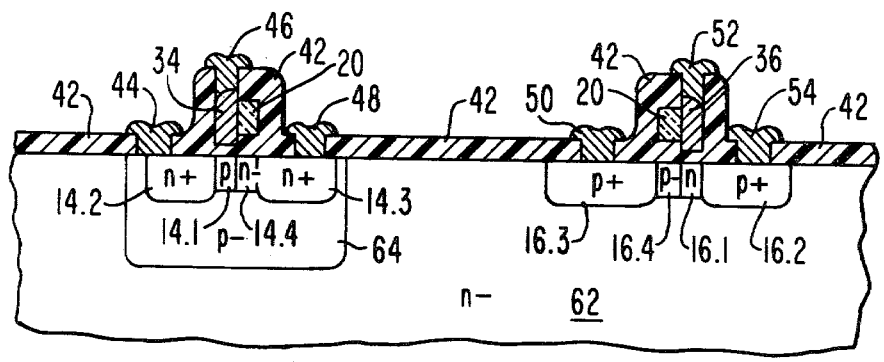

Referring now to FIGS. 9–10, when taken in conjunction with FIGS. 1–5 will illustrate the steps of carrying out the method of my invention in order to provide a submicron channel transistor in bulk silicon. In utilizing bulk silicon, one begins the process using a silicon wafer or substrate 62 having n-type conductivity modifiers therein. Thereafter, the surface of wafer 62 is provided with an apertured mask (not shown) in order to implant, for example, p-type conductivity modifiers and form p-well 64. This may be done, for example, using a boron implantation. Thereafter, the masking material is removed and another layer of masking material (not shown) is provided on the surface of the wafer 62 to implant p-type well 66. This second masking layer is then removed and replaced with still another layer of masking material (not shown) wherein originally formed p-well 64 is now counterdoped with, for example, arsenic in order to form n-well 68. This last layer of masking material is then removed and the processing continues as in FIGS. 1 and 2 wherein the device is now provided with a multilayer structure consisting of a first layer 18 of thermal or densified chemically vapor deposited (CVD) layer 18 of SiO$_2$ to a thickness of about 2000–3000 angstroms followed by layer 30 of a doped CVD oxide having a thickness of about 3000–4000 angstroms. As in the previous embodiments, layer 20 is doped with boron atoms to a concentration of about $10^{20}$ per cubic centimeter, after which the structure is provided with a cap layer 22 which is about 1000 angstroms of a CVD oxide. Finally, the structure is provided with a layer of patterned photoresist material 24 which will act as a mask for the etching steps which are required. After etching the unmasked portions, the structure, as shown in FIG. 9, will be "bulk silicon" comparable, in every respect, to the SOS structure shown in FIG. 2. The processing then continues in precisely the same manner as shown in FIGS. 3 and 4 after which the structure is provided with the usual layer of field oxide 42 having appropriate contact openings formed therein in a well known manner after which the device is metallized to form metal contacts and interconnections in each of the openings as shown in FIG. 10. As an alternative embodiment, it should now become obvious that the bulk silicon device may also be made with an extended drain portion, utilizing the processing as previously described with regard to FIGS. 6–9 in order to achieve the structure as shown in FIG. 11.

Thus, applicant has provided a novel method of manufacturing submicron channel transistors by a self-aligned gate process in which the gate electrode is formed by lateral out-diffusion and selective etching techniques that are applicable to both silicon-on-sapphire devices as well as bulk silicon devices. Additionally, the process is applicable to the formation of either conventional MOS devices or extended drain devices.

What is claimed is:

1. An improved method of making a semiconductor device which includes forming a low resistivity conductive line from a layer of semiconductor material insulated from the surface of a semiconductor body of a given conductivity type, the line having a substantially submicron width produced by introducing an etch limiting element into the wider layer of semiconductive material by lateral diffusion to define a narrower doped region in the wider layer and then subjecting the wider layer to a selective etching solution to remove the undoped material of the wider layer to the exclusion of the doped material of the doped region, the improvement comprising:

depositing a first layer of insulating material on the surface of the semiconductor body;

forming a solid source of the etch limiting element on a portion of the surface of the first insulating layer;

depositing a second layer of insulating material on the solid source;

removing a portion of the solid source and first and second layers of insulating material from the surface of the semiconductor body to define and expose an edge on the solid source adjacent the desired location of one edge of the strip-shaped layer;

growing a gate insulating layer on the surface of the semiconductor body not covered by the solid source;

depositing the wider layer of the semiconductor material on the surface of the third insulating layer with a portion thereof in lateral contact with the exposed edge of the solid source; and heating the device to laterally diffuse the etch limiting element out of the solid source and into the wider layer at a given temperature and for a time sufficient to extend the doped region to a predetermined, relatively short distance from the edge of the solid source.

2. The method of making a semiconductor device, as defined in claim 1, wherein:

the semiconductor material is polycrystalline silicon and wherein the first and third insulating layers are deposited by chemical vapor deposition from silane and oxygen; and the second layer is deposited by chemical vapor deposition from silane, oxygen, and a source of boron.

3. The method of making a semiconductor device, as outlined in claim 2, wherein:

the second layer is doped with boron atoms to a concentration ranging from about $5 \times 10^{19}$ to about $5 \times 10^{20}$ boron atoms per cubic centimeter.

4. The method of making a semiconductor device, as defined in claim 3, wherein:

the first layer has a thickness of about 2000–3000 angstroms;

the second layer has a thickness of about 3000–4000 angstroms; and the third layer has a thickness of about 1000 angstroms.

5. The method of making a semiconductor device, as defined in claim 4, wherein:

the layer of polycrystalline silicon is deposited to a thickness of between about 4000 to 5000 angstroms.

6. The method of making a semiconductor device, as defined in claim 4, wherein:

the heating step to laterally diffuse the etch limiting element is carried out at a temperature of about 900° C. for between about 10 to about 30 minutes.

7. The method of making a semiconductor device, as defined in claim 6, wherein after lateral diffusion of the etch limiting element is carried out, the method comprises the further steps of:

selectively etching the wider layer to remove the undoped material thereof to the exclusion of the doped material;

etching the first, second and third layers;

implanting into the semiconductor body conductivity modifiers of an opposite conductivity type to form drain and source regions therein;

growing a layer of field oxide over the entire structure;

etching contact holes therein in alignment with respective drain regions, source regions and laterally diffused regions; and providing metal contacts in each of the contact openings in ohmic contact with the source region, the drain region, and the laterally diffused region, respectively.

8. The method of making a semiconductor device, as defined in claim 7, wherein:

the semiconductor body is an island of silicon having a thickness of about 0.6 micron; and a semiconductor island is formed on an insulative substrate selected from the group consisting of sapphire, spinel and monocrystalline beryllium oxide.

9. The method of making a semiconductor device, as defined in claim 7, wherein:

the semiconductor body is a wafer of bulk silicon of the given conductivity type.

10. The method of making a semiconductor device, as defined in claim 8, comprising the further steps of:

masking the exposed gate insulator layer, the laterally diffused doped region and a portion of the solid source adjacent the doped region;

etching the exposed portion of the solid source to expose the surface of the semiconductor body;

removing the masking material; and implanting conductivity modifiers of the given conductivity type therein to form an extended drain device.

11. The method of making a semiconductor, as defined in claim 9, wherein:

masking the exposed gate insulator layer, the laterally diffused doped region and a portion of the solid source adjacent the doped region;

etching the exposed portion of the solid source to expose the surface of the semiconductor body;

removing the masking material; and implanting conductivity modifiers of the given conductivity type therein to form an extended drain device.

* * * * *

UNITED STATES PATENT AND TRADEMARK OFFICE
CERTIFICATE OF CORRECTION

PATENT NO. : 4,312,680
DATED : January 26, 1982
INVENTOR(S) : Sheng Teng Hsu

It is certified that error appears in the above-identified patent and that said Letters Patent is hereby corrected as shown below:

Column 1, line 15, "inteconnects" should be --interconnects--.

Column 1, line 43, "4" should be --14--.

Column 3, line 5, after "layer" insert --that--.

Column 4, line 17, after "hydroxide" insert -- - --.

Column 6, line 16, "semiconductor" should be --semiconductive--.

Column 6, line 42, "semiconductor" should be --semiconductive--.

Column 6, line 54, "semiconductor" should be --semiconductive--.

*Signed and Sealed this*

*Twenty-fifth* Day of *May 1982*

[SEAL]

*Attest:*

*Attesting Officer*

GERALD J. MOSSINGHOFF
*Commissioner of Patents and Trademarks*